(12) United States Patent
Chen et al.

(10) Patent No.: US 11,171,016 B2
(45) Date of Patent: *Nov. 9, 2021

(54) SEMICONDUCTOR PACKAGE AND MANUFACTURING PROCESS THEREOF

(71) Applicant: Taiwan Semiconductor Manufacturing Co., Ltd., Hsinchu (TW)

(72) Inventors: Yu-Feng Chen, Hsinchu (TW); Chih-Hua Chen, Hsinchu County (TW); Chen-Hua Yu, Hsinchu (TW); Chung-Shi Liu, Hsinchu (TW); Hung-Jui Kuo, Hsinchu (TW); Hui-Jung Tsai, Hsinchu (TW); Hao-Yi Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/892,320

(22) Filed: Jun. 4, 2020

(65) Prior Publication Data

US 2020/0303211 A1    Sep. 24, 2020

Related U.S. Application Data

(63) Continuation of application No. 16/396,779, filed on Apr. 29, 2019, now Pat. No. 10,707,094, which is a
(Continued)

(51) Int. Cl.
*H01L 25/065* (2006.01)
*H01L 21/48* (2006.01)
(Continued)

(52) U.S. Cl.
CPC ........ *H01L 21/4846* (2013.01); *H01L 21/486* (2013.01); *H01L 23/5383* (2013.01);
(Continued)

(58) Field of Classification Search
CPC ............. H01L 23/5383; H01L 23/5384; H01L 23/5389; H01L 25/0657;
(Continued)

(56) References Cited

U.S. PATENT DOCUMENTS 5,384,955 A * 1/1995 Booth ............... H01L 23/49827
257/E23.067
5,767,580 A    6/1998 Rostoker
(Continued)

FOREIGN PATENT DOCUMENTS

CN    103681367    3/2014
CN    103730434    4/2014
(Continued)

OTHER PUBLICATIONS

"Office Action of China Counterpart Application", dated Jul. 10, 2020, p. 1-p. 16.

*Primary Examiner* — Eugene Lee
(74) *Attorney, Agent, or Firm* — JCIPRNET (57) ABSTRACT

A semiconductor package has a first redistribution layer, a first die, a second redistribution layer, and a surface coating layer. The first die is encapsulated within a molding material and disposed on and electrically connected to the first redistribution layer. The second redistribution layer is disposed on the molding material, on the first die, and electrically connected to the first die. The second redistribution layer has a topmost metallization layer having at least one contact pad, and the at least one contact pad includes a concave portion. The surface coating layer covers a portion of the topmost metallization layer and exposes the concave
(Continued)

portion of the at least one contact pad. A manufacturing process is also provided.

20 Claims, 8 Drawing Sheets

Related U.S. Application Data continuation of application No. 15/147,910, filed on May 6, 2016, now Pat. No. 10,276,402.

(60) Provisional application No. 62/311,365, filed on Mar. 21, 2016.

(51) Int. Cl.
| | |
|---|---|
| *H01L 25/00* | (2006.01) |
| *H01L 23/538* | (2006.01) |
| *H01L 21/56* | (2006.01) |
| *H01L 23/31* | (2006.01) |
| *H01L 23/00* | (2006.01) |

(52) U.S. Cl.
CPC ...... *H01L 23/5384* (2013.01); *H01L 23/5389* (2013.01); *H01L 25/0657* (2013.01); *H01L 25/50* (2013.01); *H01L 21/568* (2013.01); *H01L 23/3128* (2013.01); *H01L 23/562* (2013.01); *H01L 2224/18* (2013.01); *H01L 2224/32225* (2013.01); *H01L 2225/0652* (2013.01); *H01L 2225/06517* (2013.01); *H01L 2225/06568* (2013.01); *H01L 2225/06572* (2013.01)

(58) Field of Classification Search
CPC ....... H01L 2224/32225; H01L 23/3128; H01L 23/562; H01L 2225/06572; H01L 2225/0652; H01L 2225/06517

See application file for complete search history.

(56) References Cited

U.S. PATENT DOCUMENTS

| | | | | |
|---|---|---|---|---|
| 6,107,180 A * | 8/2000 | Munroe | ................ | H01L 24/03 |
| | | | | 438/613 |
| 6,210,173 B1 * | 4/2001 | Matsunaga | .......... | G01R 1/0483 |
| | | | | 439/591 |
| 6,252,300 B1 * | 6/2001 | Hsuan | ................ | H01L 25/0657 |
| | | | | 257/686 |
| 6,399,477 B2 * | 6/2002 | Morozumi | ........ | H01L 21/76802 |
| | | | | 257/E21.508 |
| 6,620,731 B1 * | 9/2003 | Farnworth | ............. | H01L 24/16 |
| | | | | 438/667 |
| 6,982,487 B2 * | 1/2006 | Kim | ........ | H01L 24/10 |
| | | | | 257/774 |
| 7,034,401 B2 * | 4/2006 | Savastiouk | ........... | H01L 23/147 |
| | | | | 257/678 |
| 7,589,008 B2 * | 9/2009 | Kirby | ................ | H01L 21/76898 |
| | | | | 438/612 |
| 7,964,964 B2 * | 6/2011 | Sheats | .................... | H01L 24/16 |
| | | | | 257/737 |
| 8,159,071 B2 * | 4/2012 | Kim | ........ | H01L 24/10 |
| | | | | 257/774 |
| 9,484,291 B1 * | 11/2016 | Dhandapani | ............ | H01L 24/10 |
| 9,659,851 B2 * | 5/2017 | Wang | ................ | H01L 23/49811 |
| 9,748,192 B2 * | 8/2017 | Lee | .......... | H01L 24/11 |
| 10,276,402 B2 * | 4/2019 | Chen | .................. | H01L 21/4846 |
| 10,707,094 B2 * | 7/2020 | Chen | .................. | H01L 25/0657 |
| 2006/0289968 A1 * | 12/2006 | Sulfridge | .......... | H01L 27/14601 |
| | | | | 257/621 |
| 2008/0054444 A1 * | 3/2008 | Tuttle | ................ | H01L 25/0657 |
| | | | | 257/698 |
| 2008/0073769 A1 * | 3/2008 | Wu | ........ | H01L 25/105 |
| | | | | 257/686 |
| 2009/0127703 A1 * | 5/2009 | Lee | .......... | H01L 24/05 |
| | | | | 257/737 |
| 2009/0283872 A1 * | 11/2009 | Lin | .......... | H01L 24/96 |
| | | | | 257/621 |
| 2011/0089539 A1 * | 4/2011 | Akram | ............ | H01L 27/14618 |
| | | | | 257/620 |
| 2013/0168856 A1 * | 7/2013 | Wang | .................. | H01L 23/3128 |
| | | | | 257/738 |
| 2014/0103488 A1 * | 4/2014 | Chen | ........ | H01L 24/19 |
| | | | | 257/532 |
| 2014/0319683 A1 * | 10/2014 | Lin | .................... | H01L 23/3114 |
| | | | | 257/738 |

FOREIGN PATENT DOCUMENTS

| | | |
|---|---|---|
| CN | 104051388 | 9/2014 |
| CN | 104064531 | 9/2014 |
| CN | 104576547 | 4/2015 |
| CN | 105261606 | 1/2016 |
| CN | 105321801 | 2/2016 |
| KR | 20100029398 | 3/2010 |

* cited by examiner

SEMICONDUCTOR PACKAGE AND MANUFACTURING PROCESS THEREOF

CROSS-REFERENCE TO RELATED APPLICATION

This application is a continuation application of and claims the priority benefit of U.S. patent application Ser. No. 16/396,779, filed Apr. 29, 2019 and now allowed. The prior application Ser. No. 16/396,779 is a continuation application of and claims the priority benefit of U.S. patent application Ser. No. 15/147,910, filed May 6, 2016 and now issued as U.S. Pat. No. 10,276,402B2, and claims the priority benefit of U.S. provisional application Ser. No. 62/311,365, filed on Mar. 21, 2016. The entirety of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
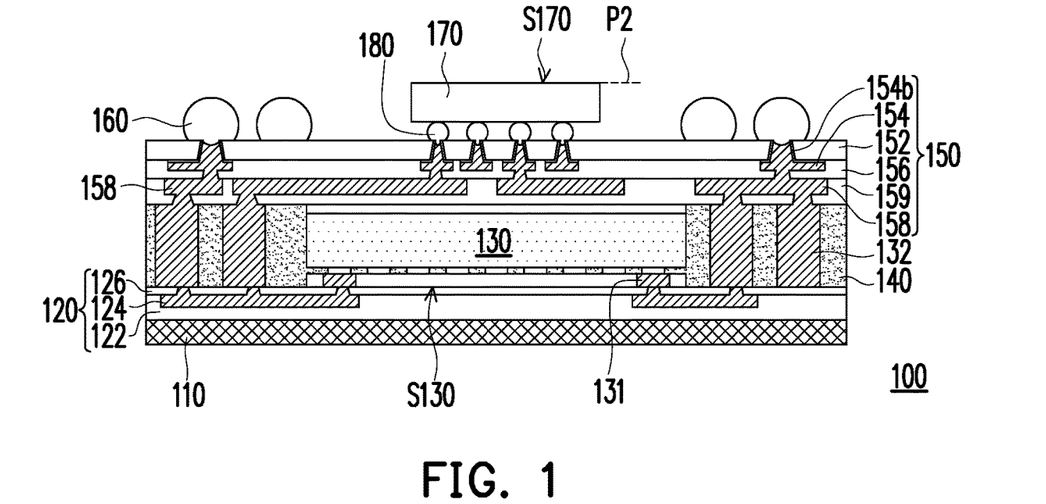
FIG. 1 is a schematic cross sectional view illustrating a semiconductor package according to some exemplary embodiments of the present disclosure.

FIG. 1 is a schematic cross sectional view illustrating a semiconductor package according to some exemplary embodiments. Referring to FIG. 1, in some embodiments, a semiconductor package 100 includes a protection layer 110, a first redistribution layer 120, a first die 130, a second redistribution layer 150, and at least one conductive element 160. In some embodiments, the first redistribution layer 120 and the second redistribution layer 150 are located at two opposite sides of the first die 130. The protection layer 110 covers the first redistribution layer 120. In some embodiments, the protection layer 110 includes, for example, a glass cover, a cover plate, a hard coating layer, or any other suitable protective films. In some embodiments, the protection layer 110 further includes a functional layer, such as a polarizing film, a color film, an anti-reflection layer or an anti-glare layer. The protection layer 110 may allow light at certain wavelengths to pass through. That is to say, the light that may pass through the protection layer 110 may be invisible light or visible light, or light of different colors depending on the wavelengths allowed to pass through. A suitable protection layer 110 is selected based on the design and the requirements of the products. Furthermore, in some embodiments, an adhesive layer (not shown) is disposed between the protection layer 110 and the first redistribution layer 120. The adhesive layer includes, for example, an ultra-violet (UV) curable adhesive, a heat curable adhesive, an optical clear adhesive or a light-to-heat conversion (LTHC) adhesive, or the like, although other types of adhesives may be used. In addition, the adhesive layer is also adapted to allow light or signal to pass through.

In some embodiments, in FIG. 1, the first die 130 sandwiched between the first and second redistribution layers 120, 150 and is disposed on and electrically connected to the first redistribution layer 120. In some embodiments, the first redistribution layer 120 includes one or more metallization layers and one or more polymer-based dielectric layers. As seen in FIG. 1, the first redistribution layer 120 includes a first polymer dielectric material layer 122, a metallization layer 124 and a second polymer dielectric material layer 126. The metallization layer 124 is sandwiched between the second polymer dielectric material layer 126 and the first polymer dielectric material layer 122. In some embodiments, the material of the metallization layer 124 includes aluminum, titanium, copper, nickel, tungsten, and/or alloys thereof. In some embodiments, the material of the polymer dielectric material layers includes polymide, benzocyclobutene (BCB), polybenzooxazole (PBO), or any other suitable polymer-based dielectric material.

Referring to FIG. 1, in some embodiments, the front surface S130 of the first die 130 faces the protection layer 110. In one embodiment, the metallization layer 124 is connected to contacts 131 located on the front surface S130 of the first die 130 so as to be electrically connected to the first die 130. In certain embodiments, since the metallization layer 124 is connected to the contacts 131 arranged at the periphery of the front surface S130 of the first die 130, the metallization layer 124 does not block most of the first die 130 from sensing light or signal and the first die 130 is still able to receive and detect light or signal passing through the protection layer 110.

In some embodiments, the first die 130 is a sensor chip comprising one or more sensor devices. In certain embodiments, the first die 130 includes at least one fingerprint sensor such as an optical fingerprint sensor or a capacitance fingerprint sensor, or other suitable type of sensors. In some embodiments, the first die 130 is a sensor chip and the first redistribution layer 120 is the front-side redistribution layer as the first die 130 may detect or sense light or signal that passes through the protection layer 110. However, the first die 130 may be other types of dies or chips with different functions to match with product design. In one embodiment, the first die 130 is arranged to face downward (i.e. the front surface S130 faces downward and toward the protection layer 110), in the package structure as shown in FIG. 1, and in such arrangement, the redistribution layer 120 is located on the protection layer 110.

In some embodiments, in FIG. 1, the first die 130 is encapsulated within a molding material 140 and through vias 132 penetrating through the molding material 140 are connected to the first redistribution layer 120 and the second redistribution layer 150. The molding material 140 includes, for example, an epoxy resin, or any other suitable type of molding material. In certain embodiments, the through vias 132 are through interlayer vias (TIVs) and may further includes barrier layers (not shown) located between the through vias 132 and the molding material 140.

In some embodiments, in FIG. 1, the second redistribution layer 150 is disposed on the molding material 140 and the first die 130, and is electrically connected to the first die 130 through the through vias 132 and the first redistribution layer 120. The second redistribution layer 150 includes one or more metallization layers and one or more polymer-based dielectric layers. In certain embodiments, the second redistribution layer 150 is a back-side redistribution layer, in the package structure as shown in FIG. 1, and in such arrangement, the redistribution layer 150 is located above the first die 130 and the second redistribution layer 150 includes at least a metallization layer 154 and a polymer dielectric material layer 152. In one embodiment, in the configuration of the package structure as shown in FIG. 1, the metallization layer 154 is the topmost (outermost) metallization layer and the polymer dielectric material layer 152 is the topmost (outermost) polymer dielectric material layer. In some embodiments, the second redistribution layer 150 further includes polymer dielectric material layers 156, 159 and a metallization layer 158 sandwiched there-between. The materials of the layers of the second redistribution layer 150 is similar to the materials of the layers of the first redistribution layer 120, and will not be repeated herein.

Figure 15A:
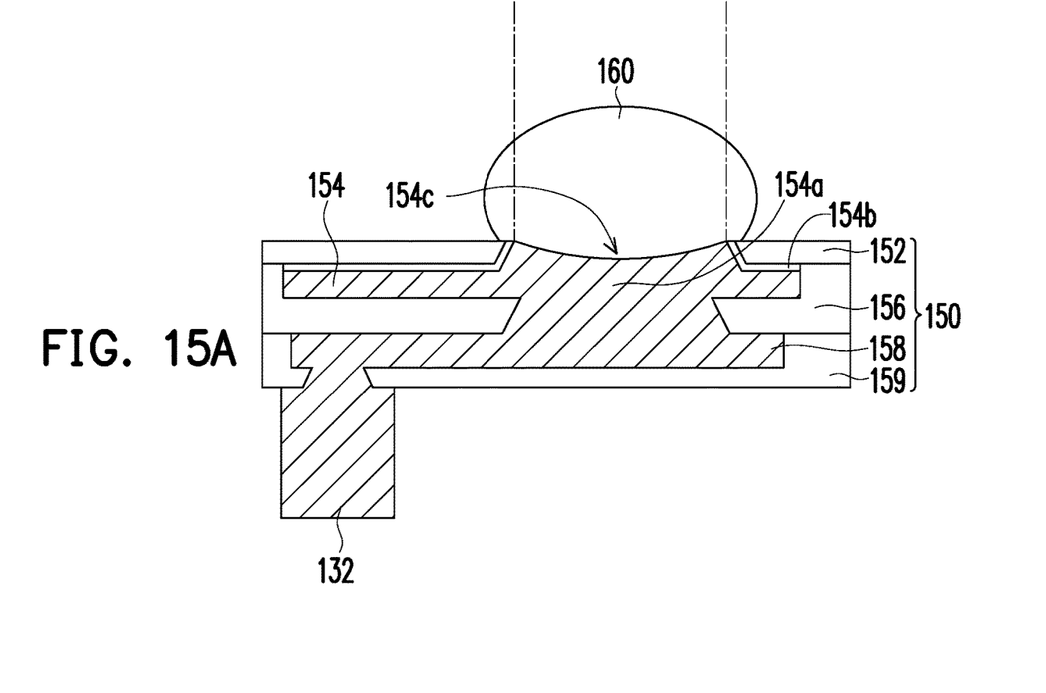
FIG. 15A is an enlarged schematic partial cross sectional view of the second redistribution layer of FIG. 1.
Figure 15B:
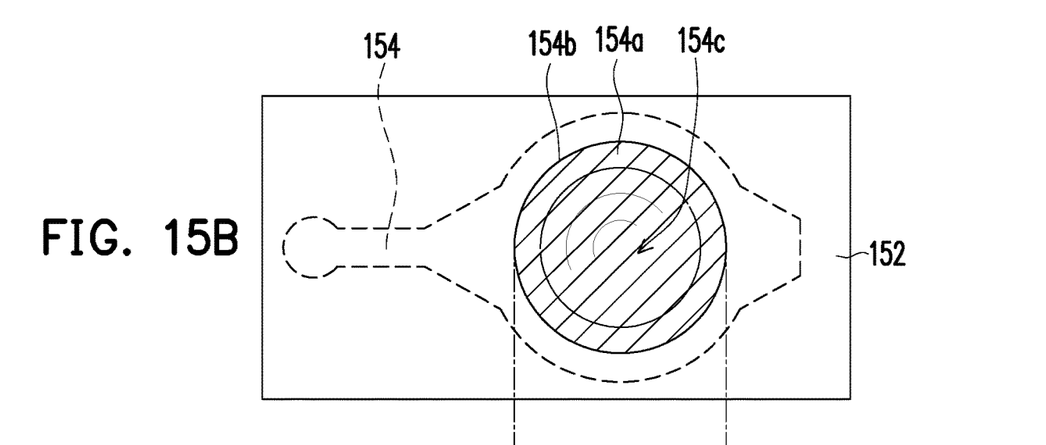
FIG. 15B is a schematic top view of the second redistribution layer of FIG. 15A.

FIG. 15A is an enlarged schematic partial view of the second redistribution layer 150 of FIG. 1. FIG. 15B is a schematic top view of the second redistribution material 150 in FIG. 15A, except for the conductive element 160 is omitted for description purposes. Referring to FIG. 15A and FIG. 15B, in some embodiments, the topmost metallization layer 154 includes one or more contact pads 154a not covered by the topmost polymer dielectric material layer 152, and the conductive element 160 is located on the contact pad 154a. In certain embodiments, the contact pad 154a includes a concave portion 154c and the conductive element 160 residing on the contact pad 154a covers the concave portion 154c. In certain embodiments, a surface coating layer 154b covering a portion of the metallization layer 154 and exposing the concave portion 154c of the contact pad 154a is further included. In some embodiments, a material of the metallization layer 154 includes copper or copper alloys, and the surface coating layer 154b includes a composite layer of a titanium layer and a copper layer. However, the material of the surface coating layer 154b may include tantalum or any suitable barrier material.

Figure 14A:
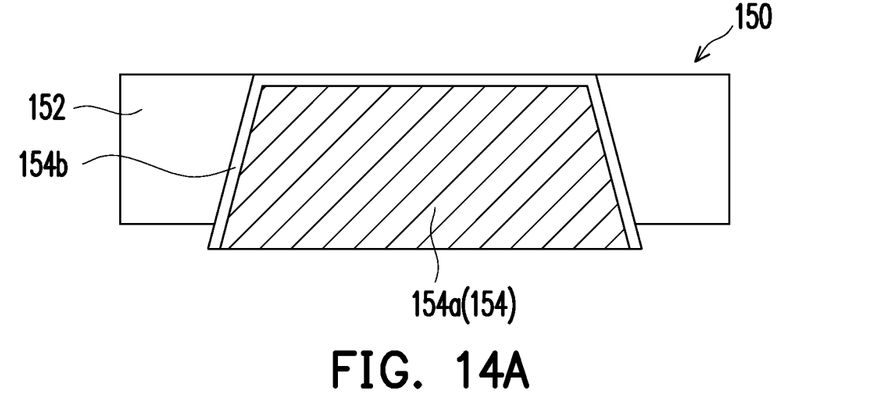
FIG. 14A to FIG. 14C are partial schematic cross sectional views of various stages in the manufacturing process of the semiconductor package of FIG. 12.
Figure 14B:
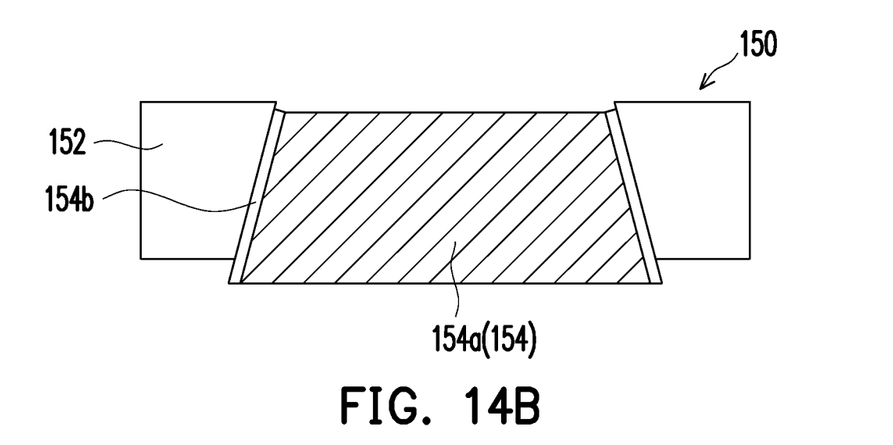
Figure 14C:
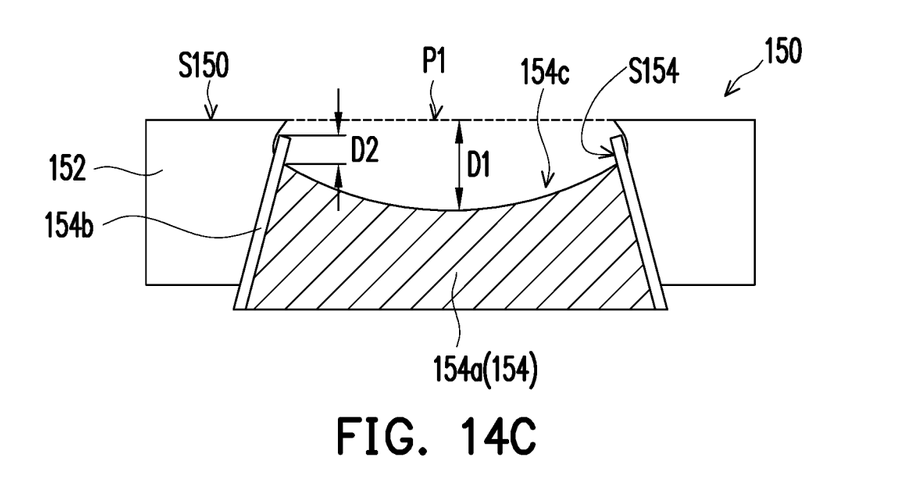

FIG. 14C is an enlarged schematic cross section view of the second redistribution layer 150 of FIG. 1. Referring to FIG. 14C, the concave portion 154c of the contact pad 154a exposes a sidewall S154 of the surface coating layer 154b. In addition, there is a distance D1 measuring from a center of the spherical surface or ellipsoid of the concave portion 154c of the contact pad 154a to a plane P1 extending along the top surface S150 of the second redistribution layer 150 in a normal direction of the plane P1. That is to say, the distance D1 is from the lowest point of the concave portion 154c to the top surface S150 in a direction perpendicular to the plane P1. The distance D1 is greater than a height D2 of the exposed sidewall S154 of the surface coating layer 154b in a normal direction of the plane P1. In some embodiments, the distance D1 is greater than or equal to 0.1 micrometers, and the height D2 is greater than or equal to 0.01 micrometers. Thus, as seen in FIG. 14C, the surface coating layer 154b is higher than the contact pad 154a. Furthermore, both the surface coating layer 154b and the contact pad 154a are lower than the top surface S150 of the polymer dielectric material layer 152. Thus, different kinds of integrated circuits (IC) such as a control IC or a high voltage chip can be packaged with higher flexibility in choices. In addition, the thickness or overall height of the package structure is reduced, and the cost is also lowered. In some embodiments, as the contact pad 154a is concave and lower than the top surface S150, the solder paste and the balls or bumps are able to be accurately located on the contact pads, thus improving the ball drop yield and enhancing the reliability of the package.

Referring back to FIG. 1, in some embodiments, the semiconductor package 100 further includes one or more conductive elements 160 and one or more electrical connectors 180 located on the contact pads 154 of the topmost metallization layer 154. FIG. 1 shows four conductive elements 160 and four electrical connectors 180 but the number and the arrangement of the conductive elements and electrical connectors 180 may be adjusted according to layout or routing requirements. In some embodiments, the conductive elements 160 are, for example, solder balls or ball grid array (BGA) balls placed on the concave portions 154c of the contact pads 154a exposed by the topmost polymer dielectric material layer 152 of the second redistribution layer 150 and the contact pads 154a under the conductive elements 160 function as ball pads. In addition, the conductive elements 160 and the electrical connectors 180 disposed on exposed portions of the topmost metallization layer 154 are electrically connected to the second redistribution layer 150. In some embodiments, the electrical connectors 180 are, for example, bumps and the contact pads 154a under the electrical connectors 180 function as bump pads. A second die 170 is disposed on the electrical connectors 180 and above the second redistribution layer 150, so as to be electrically connected to the second redistribution layer 150 through the electrical connectors 180. In certain embodiments, as the contact pads 154a are dished with bowl-shaped concave portions 154c, the height of the conductive elements 160 and electrical connectors 180 located on the concave contact pads 154a becomes lower, when compared with those located on the flat contact pads. In certain embodiments, the total height of the semiconductor package 100 becomes smaller. In some embodiments, the conductive elements 160 are slightly higher or substantially co-levelled with the top surface S170 of the second die 170, depending on the thickness of the second die 170. In one embodiment, a plane P2 extending from the top surface S170 of the second die 170 is above the topmost point of the conductive elements 160. Thus, the overall height of the semiconductor package 100 is reduced. In some embodiments, the second die 170 is a high voltage chip or a voltage modulation chip. However, the disclosure is not limited thereto, and the second die 170 may be any suitable chip according to the product requirements.

The through vias 132 penetrating through the molding material 140 electrically connect the first redistribution layer 120 and the second redistribution layer 150. In certain embodiments, the through vias 132 together with the metallization layers in the first redistribution layer 120 and the second redistribution layer 150 may constitute an interconnect structure, which electrically connects the first die 130 and the conductive elements 160. In some embodiments, the second die 170 is electrically connected to the interconnect structure though the electrical connectors 180, and the first die 130 and the second die 170 may be electrically connected. In some embodiments, the semiconductor package 100 is further turned upside down and mounted onto a circuit board or a system board (not shown) by connecting the conductive elements 160 to the circuit board or system board. In this configuration, the protection layer 110 faces upwards, and the first die 130 is to detect or sense light or signal.

In alternative embodiments, the semiconductor package 100 may further include additional dies disposed over the first die 130 and aside the second die 170, and the interconnect structure may be adjusted to electrically connect the additional dies. The structure of the present disclosure is not limited to include only the first die 130 and the second die 170.

Figure 2:
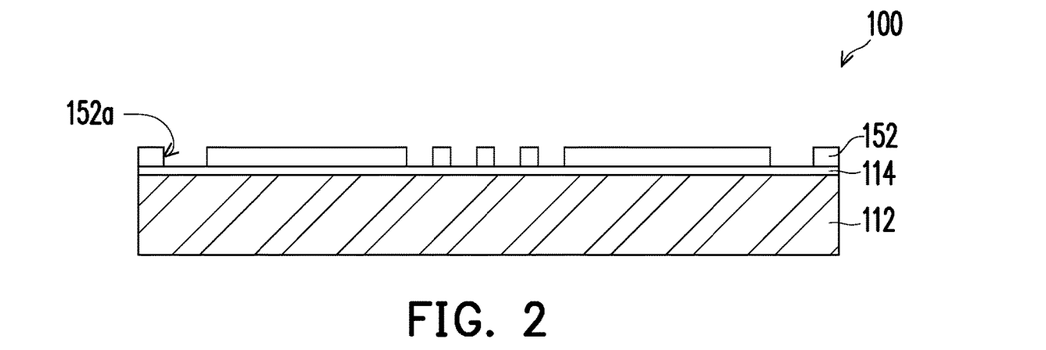
FIG. 2 to FIG. 13 are schematic cross sectional views of various stages in a manufacturing process of a semiconductor package according to some exemplary embodiments of the present disclosure.

FIG. 2 to FIG. 12 are schematic cross sectional views of various stages in a manufacturing process of a semiconductor package according to some exemplary embodiments. The same elements described in FIG. 1 will use the same reference numbers, and certain details or descriptions of the same elements will not be repeated herein. In exemplary embodiments, the semiconductor manufacturing process is part of a wafer level packaging process. In some embodiments, one die is shown to represent plural dies of the wafer, and one single package is shown to represent plural semiconductor packages obtained following the semiconductor manufacturing process. Referring to FIG. 2, in some embodiments, a carrier 112 is provided; the carrier 112 may be a glass carrier or any suitable carrier for the manufacturing process of the semiconductor package. In some embodiments, the carrier 112 is coated with a debond layer 114. The material of the debond layer 114 may be any material suitable for debonding the carrier 112 from the above layers disposed thereon. Next, a polymer dielectric material layer 152 is formed on the carrier 112 and the polymer dielectric material layer 152 is patterned so as to have a plurality of openings 152a exposing the debond layer 114.

Figure 3:
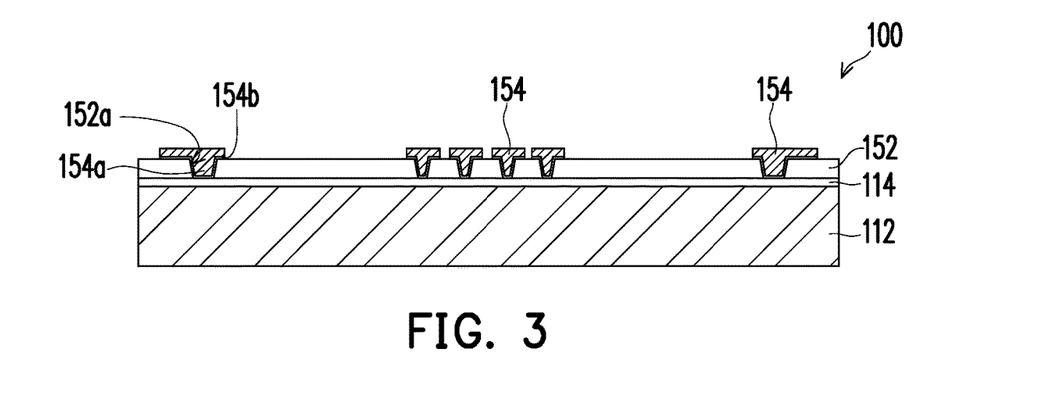

Referring to FIG. 3, the surface coating layer 154b and the metallization layer 154 are sequentially formed over the polymer dielectric material layer 152 and then patterned. In certain embodiments, after patterning, the surface coating layer 154b conformally covers the profiles of the openings 152a and the metallization layer 154 fills up the openings 152a and partially covers the polymer dielectric material layer 152. The metallization layer 154 includes at least more than one contact pads 154a. In certain embodiments, the surface coating layer 154b is formed by, for example, deposition, sputtering, electroplating, or any other suitable method. In certain embodiments, the metallization layer 154 may be formed by electroplating or deposition. As shown in FIG. 3, prior to forming the metallization layer 154, the surface coating layer 154b is formed over the polymer dielectric material layer 152 and covering the openings 152a, the surface coating layer 154b conformally covers the bottom surface of the metallization layer 154.

Figure 4:
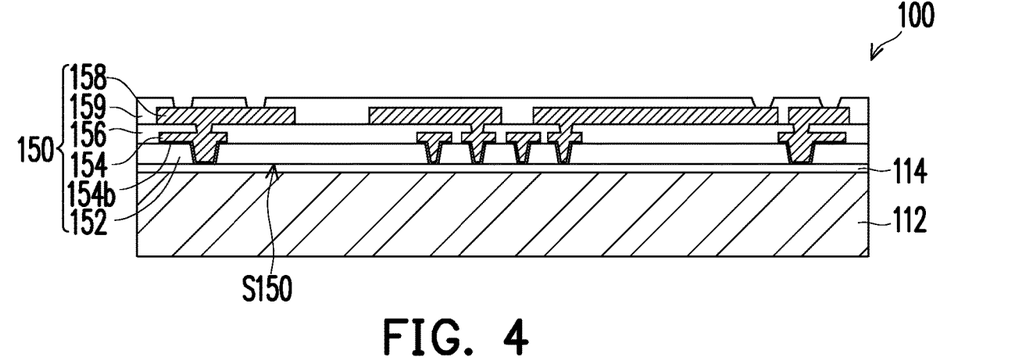

Referring to FIG. 4, in some embodiments, additional polymer dielectric material layers 156, 159 are formed and an additional metallization layer 158 is formed. In certain embodiments, the polymer dielectric material layer 156 is formed on the metallization layer 154 and the polymer dielectric material layer 152, the metallization layer 158 is formed on the polymer dielectric material layer 156 and then the polymer dielectric material layer 159 is formed on the metallization layer 158 and the polymer dielectric material layer 156. In one embodiment, the polymer dielectric material layers 156, 159 also have patterns to either accommodate or to expose the metallization layer 158, and the metallization layer 158 is connected to the metallization layer 154. In certain embodiments, the second redistribution layer 150 is formed by the polymer dielectric material layers 152, 156, 159 and the metallization layers 154, 158 layer by layer. That is to say, referring to FIG. 2 to FIG. 4, in some embodiments, the second redistribution layer 150 formed on the carrier 112 with the surface S150 of the second redistribution layer 150 in contact with the debond layer 114 and facing the carrier 112. In some embodiments, the second redistribution layer 150 may include more or less than the three polymer dielectric material layers 154, 156, 159 shown in FIG. 4. In alternative embodiments, the second redistribution layer 150 may include more or less than the two metallization layers. The number of metallization layers and the number of polymer dielectric material layers may be adjusted depending on the routing requirement of the respective semiconductor package.

Figure 5:
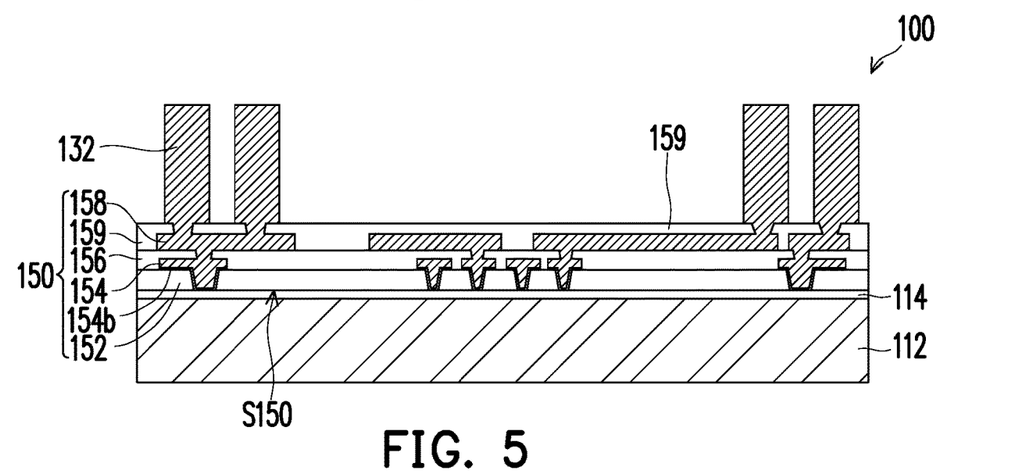

Referring to FIG. 5, in some embodiments, the through vias 132 are formed on the second redistribution layer 150 and electrically connected to the second redistribution layer 150. Specifically, in some embodiments, the through vias 132 are formed on the polymer dielectric material layer 159 and connected to the metallization layer 158 through the openings of the polymer dielectric material layer 159. In some embodiments, the through vias 132 are formed by electroplating, deposition or any other suitable method.

Figure 6:
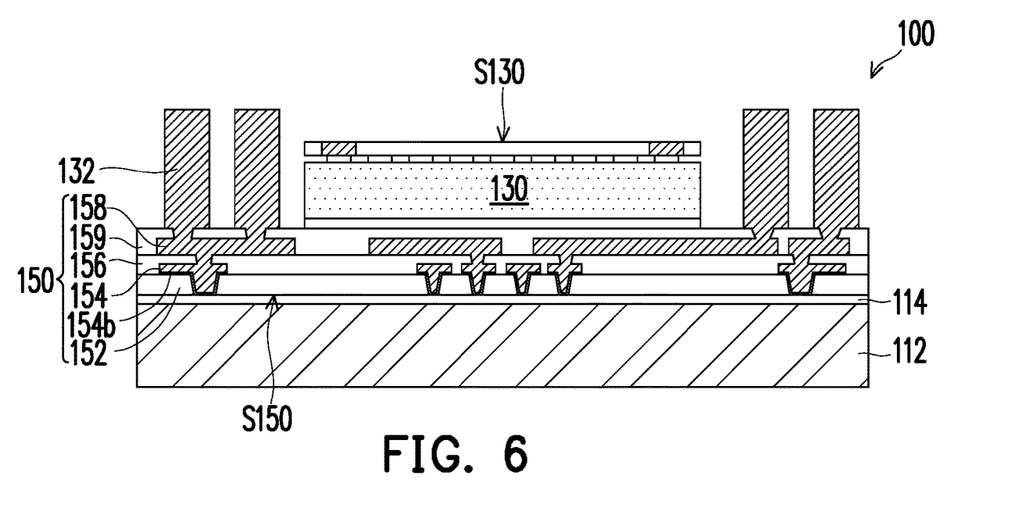

Referring to FIG. 6, in some embodiments, the first die 130 is disposed on the second redistribution layer 150. In exemplary embodiments, the first die 130 is a sensor chip comprising one or more sensor devices. In certain embodiments, the first die 130 includes at least one fingerprint sensor such as an optical fingerprint sensor or a capacitance fingerprint sensor, or other suitable type of sensors including charge-coupled devices (CCDs). In some embodiments, the first die 130 is a sensor chip and the first die 130 is disposed on the second redistribution layer 150 such that the front surface S130 of the first die 130 faces away from the second redistribution layer 150 (i.e. facing up in FIG. 6). In the step shown in FIG. 6, the first die 130 is disposed on the polymer dielectric material layer 159 and the backside of the first die 130 contacts the polymer dielectric material layer 159 of the second redistribution layer 150. The first die 130 is not contacted with the through vias 132.

Figure 7:
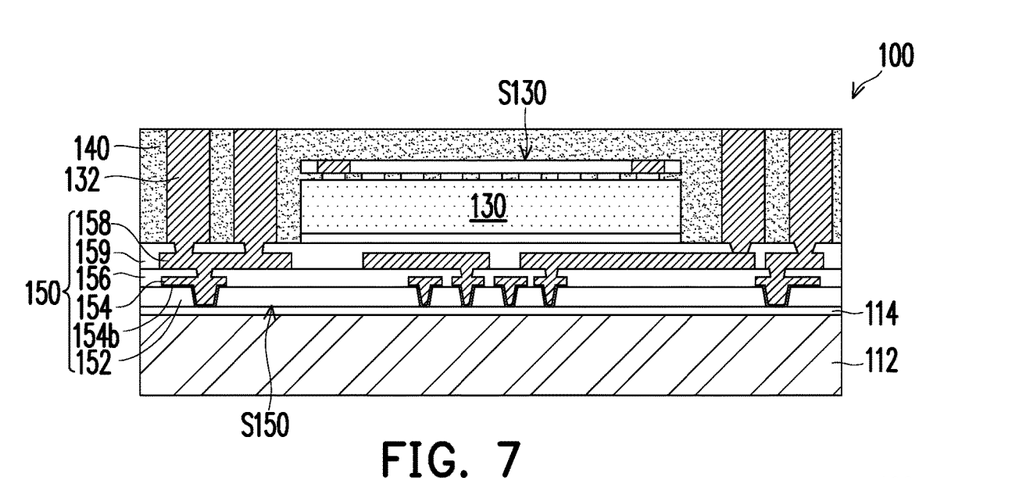

Referring to FIG. 7, in some embodiments, the first die 130 and the through vias 132 on the second redistribution layer 150 are molded in the molding material 140. In some embodiments, the molding material 140 fills the gaps between the first die and the through vias 132, and covers the second redistribution layer 150. In some embodiments, the molding material 140 is formed over the first die 130 and covers the front surface S130 of the first die 130.

Figure 8:
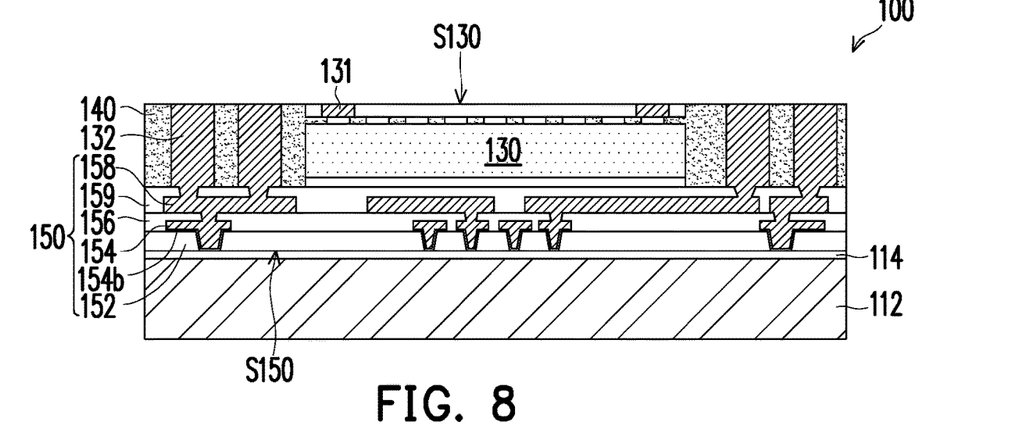

Referring to FIG. 8, in some embodiments, the molding material 140 and the through vias 132 are planarized until the front surface S130 of the first die is exposed. In some embodiment, the over-molded molding material 140 and the through vias 132 are polished until the contacts 131 of the first die 130 are exposed. In one embodiment, the through vias 132, the molding material 140, and the first die 130 are processed to become substantially coplanar. In some embodiments, the molding material 140, the through vias 132, and the first die 130 are planarized through a grinding process or a chemical mechanical polishing (CMP) process. After the grinding process, a cleaning step may be optionally performed, for example to clean and remove the residue generated from the grinding step. However, the disclosure is not limited thereto, and the planarizing step may be performed through any other suitable method.

Figure 9:
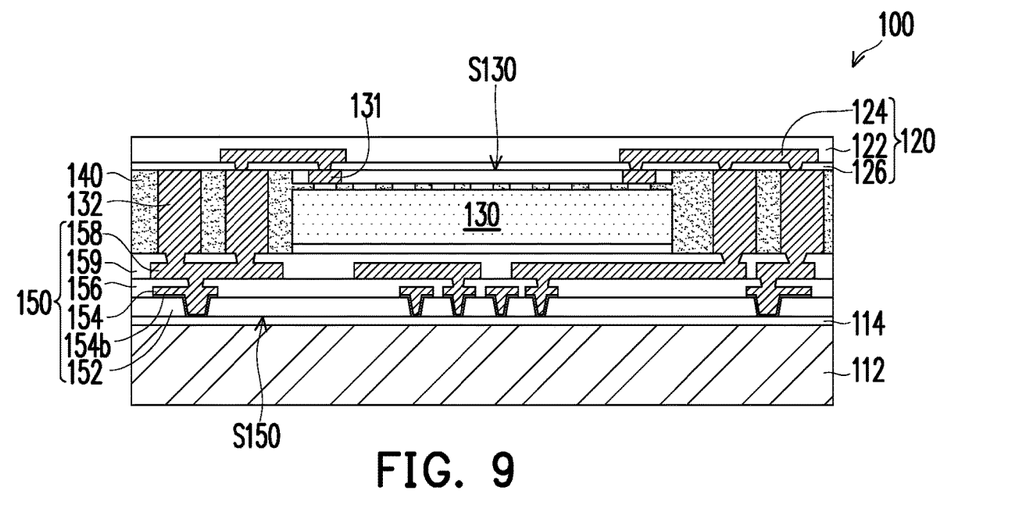

Referring to FIG. 9, the first redistribution layer 120 is formed on the molding material 140, on the first die 130, and on the through vias 132. In some embodiment, the first redistribution layer 120 is electrically connected to the through vias 132 and the first die 130. The formation of the first redistribution layer 120 includes sequentially forming the second polymer dielectric material layer 126, the metallization layer 124, and the first polymer dielectric material layer 122 layer by layer. The method of forming the first redistribution layer 120 is similar to the method of forming the second redistribution layer 150, and the same description will not be repeated herein. In some embodiments, the metallization layer 124 is connected to the exposed contacts 131 of the first die 130 and electrically connected to the first die 130. In some embodiments, the metallization layer 124 is connected to top sides of the through vias and electrically connected to the second redistribution layer 150 via the through vias 132.

Figure 10:
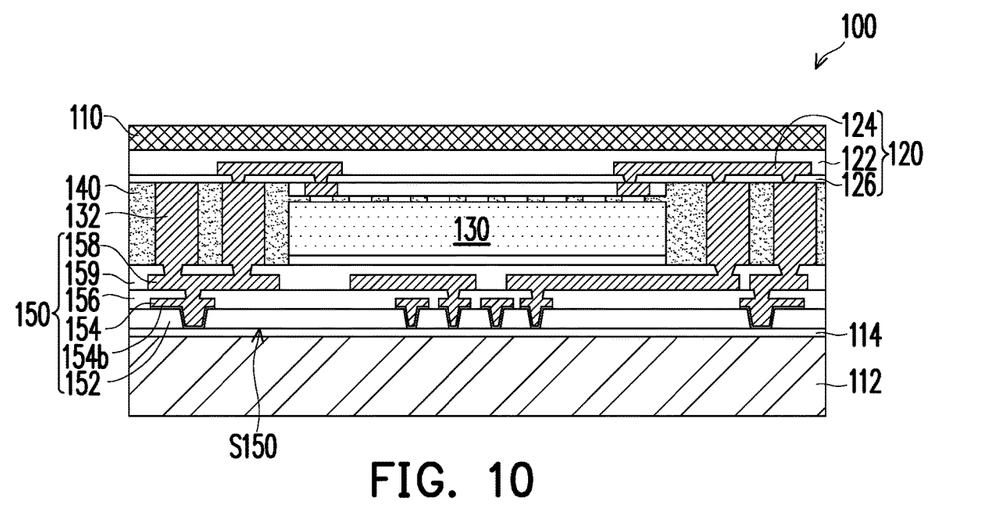

Then, referring to FIG. 10, in some embodiments, the protection layer 110 is disposed on the first redistribution layer 120 and the protection layer 110 contacts the first polymer dielectric material layer 122. In some embodiments, the protection layer 110 includes, for example, a glass cover, a cover plate, a hard coating layer, or any other suitable protective films. In some embodiments, the protection layer 110 further includes a functional layer, such as a polarizing film, a color film, an anti-reflection layer or an anti-glare layer. In certain embodiments, the protection layer 110 at least allows specific signal or light at certain wavelengths to pass through. In some embodiments, the adhesive layer (not shown) is first applied onto the first redistribution layer 120 or to the protection layer 110, and then the protection layer 110 is disposed on the first redistribution layer 120 to be adhered to the first redistribution layer.

Figure 11:
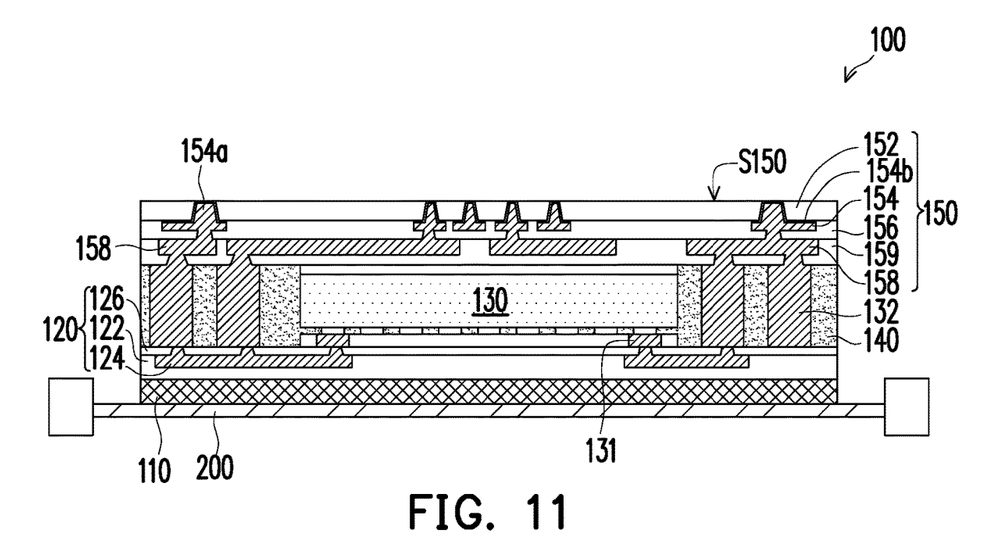

Referring to FIG. 11, in some embodiments, the carrier 112 is debonded from the second redistribution layer 150. The package structure 100 is easily separated from the carrier 112 due to the debond layer 114 (shown in FIG. 10). In some embodiments, the package structure 100 debonded from the carrier 112 is then flipped (turned upside down) and is disposed on a tape 200. In some embodiments, the tape 200 is, for example, a carrier tape, but the tape 200 may also be another suitable type of carrier for carrying the package structure 100 debonded from the carrier 112. As seen in FIG. 11, the remaining structure debonded from the carrier 112 is flipped so that the protection layer 110 is disposed directly on the tape 200 and faces the tape 200, while the surface S150 of the second redistribution layer 150 faces upwards becomes the top surface, and the metallization layer 154 becomes the topmost metallization layer of the second redistribution layer 150. The contact pads 154a of the topmost metallization layer 154 are exposed by the polymer dielectric material layer 152.

Figure 12:
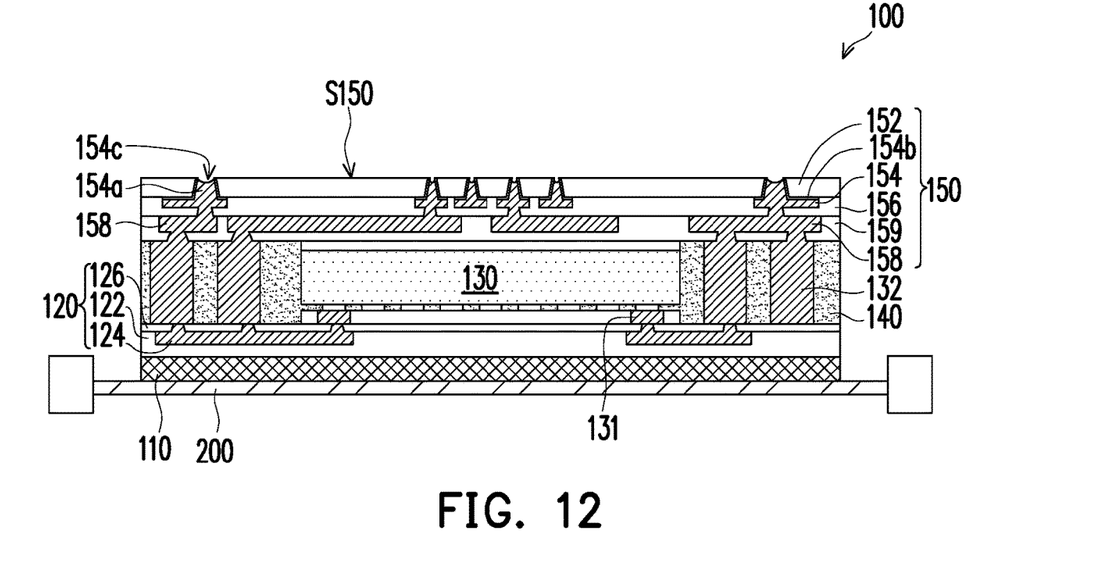

Referring to FIG. 12, in some embodiments, the topmost metallization layer 154 exposed by the polymer dielectric material layer 152 is etched. In certain embodiments, the contact pads 154a of the topmost metallization layer 154 are etched. FIG. 14A to FIG. 14C are partial schematic cross sectional views of various stages in the manufacturing process of the semiconductor package of FIG. 12. Specifically, as seen in FIG. 14A, after debonding and flipping, the topmost metallization layer 154 including contact pads 154a and the surface coating layer 154b covering the contact pads is exposed and subject to etching. In FIG. 14B, a dry etching process is performed to etch away a portion of the surface coating layer 154b. In one embodiment, the surface coating layer 154b includes titanium and copper. In another embodiment, the surface coating layer 154b is a composite layer of Ti/Cu. In some embodiment, the dry etching process includes at least titanium dry etching process to partially remove the surface coating layer 154b exposed by the polymer dielectric material layer 152. As seen in FIG. 14B, after the surface coating layer 154b is partially removed by the dry etching process, the surface coating layer 154b now exposes a part of the contact pads 154a of the metallization layer 154. In one embodiment, the dry etching process is performed by, for example, using fluorocarbon-based etchants to partially remove the surface coating layer 154b. Next, in FIG. 14C, a wet etching process is performed towards the exposed contact pad 154a to form the concave portion 154c in the contact pad 154a. In some embodiments, the wet etching process includes a titanium wet etching process, and the wet etching process removes a portion of the exposed contact pads 154a to form the concave portion 154c in the contact pad 154a and further removes a portion of the surface coating layer 154b. In some embodiments, the wet etching process is performed by using, for example, phosphoric acid with hydrogen peroxide. However, the disclosure is not limited thereto, and the chemical or reagents used for the dry or wet etching may be any other suitable type of chemicals chosen depending on the recipe. As seen in FIG. 14C, in some embodiments, the contact pad 154a is further etched to form the concave portion 154c and to expose the sidewall S154 of the surface coating layer 154b. In one embodiment, more material of the contact pad 154a is removed during the wet etching process, as less or little material of the surface coating layer is removed. Thus, as seen in FIG. 14C, in certain embodiments, the surface coating layer 154b is higher than the contact pad 154a, and both the surface coating layer 154b and the contact pad 154a are lower than the top surface S150 of the polymer dielectric material layer 152. Since the contact pad 154a has the concave portion 154c, the subsequently formed solder paste and balls or bumps formed thereon can be accurately positioned on the contact pads 154a, thus improving the ball drop yield and package reliability. The structure of the contact pad 154a and the concave portion 154c may be referred to in the above description, and the same will not be repeated herein. In some embodiments, the contact pad 154a with the concave portion 154c is formed, and the contact pads 154a that are a part of the metallization layer 154 serve as bump pads or ball pads.

Figure 13:
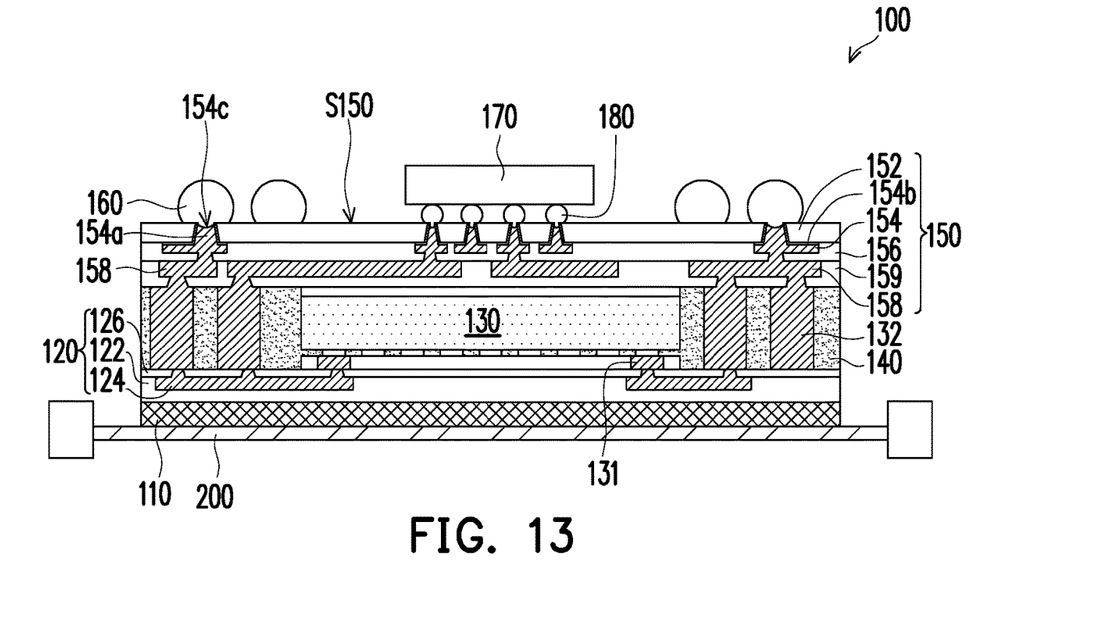

Referring to FIG. 13, in some embodiments, the conductive elements 160 are disposed on the contact pads 154a of the top metallization layer 154 and the second die 170 is disposed on the top surface S150 of the second redistribution layer 150. In some embodiments, before disposing the second die 170 to the metallization layer 154, the electrical connectors 180 are disposed on the contact pads 154a, and then the second die 170 is disposed on and connected to the electrical connectors 180. In some embodiments, prior to disposing the conductive elements 160 and the electrical connectors 180, solder paste (not shown) or flux is applied on the concave portions 154c of the contact pads 154a so that the electrical connectors 180 and the conductive elements 160 are better fixed to the contact pads 154a. In some embodiments, due to the concave portions 154c of the contact pads 154a, the conductive elements 160 and the electrical connectors 180 can be located on the contact pads more accurately and better fixed to the contact pads 154a. In some embodiments, as the conductive elements 160 and the electrical connectors 180 are disposed on the lower concave portions 154c of the contact pads 154a, the height of the package structure 100 is decreased and the package structure 100 becomes thinner. In some embodiments, the conductive elements 160 are electrically connected to the second redistribution layer 150, the first redistribution layer 120 and the first die 130. In some embodiments, the second die 170 is electrically connected to the second redistribution layer 150 and may be electrically connected to the first die 130. Although the obtained semiconductor package 100 as described above is disposed on the tape 200, the semiconductor package 100 will be separated from the tape 200 and diced in the subsequent processes. In some embodiments, the manufacturing process described above is part of a wafer level packaging process, a plurality of semiconductor packages 100 are obtained after the wafer dicing process. In some embodiments, the tape 200 is separated from the semiconductor packages 100 prior to wafer dicing.

FIG. 15A is an enlarged schematic partial cross sectional view of the second redistribution layer of FIG. 1. FIG. 15B is a schematic top view of the second redistribution layer of FIG. 15A, and the conductive element 160 is not shown in FIG. 15B for illustrative purposes. Referring to FIG. 15A and FIG. 15B, in some embodiments, the conductive element 160 is disposed mainly on the concave portion 154c of the contact pad 154a. As seen in FIG. 15B, the concave portion 154c of the contact pad 154a is exposed by the polymer dielectric material layer 152 of the second redistribution layer 150 while the rest of the top metallization layer 154 is not exposed and covered by the polymer dielectric material layer 152. In some embodiments, the portion of the top metallization layer 154 covered by the polymer dielectric material layer 152 may include lines, traces, or other routings to be electrically connected to other metallization layers or the through vias 132.

Figure 16A:
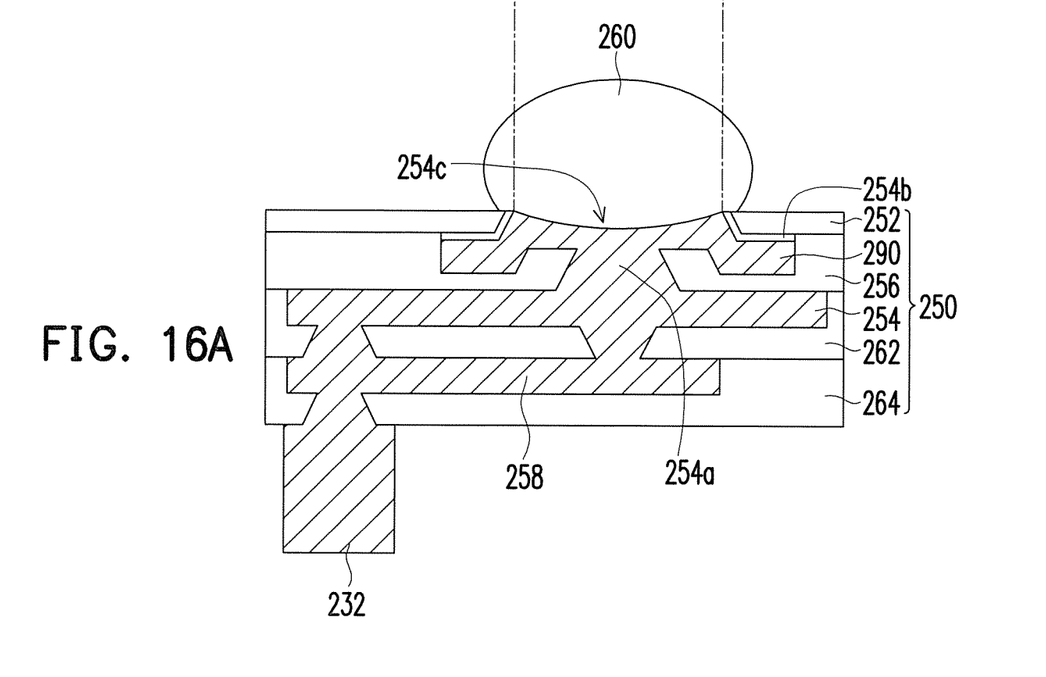
FIG. 16A is an enlarged schematic partial cross sectional view of a second redistribution layer according to some exemplary embodiments of the present disclosure.
Figure 16B:
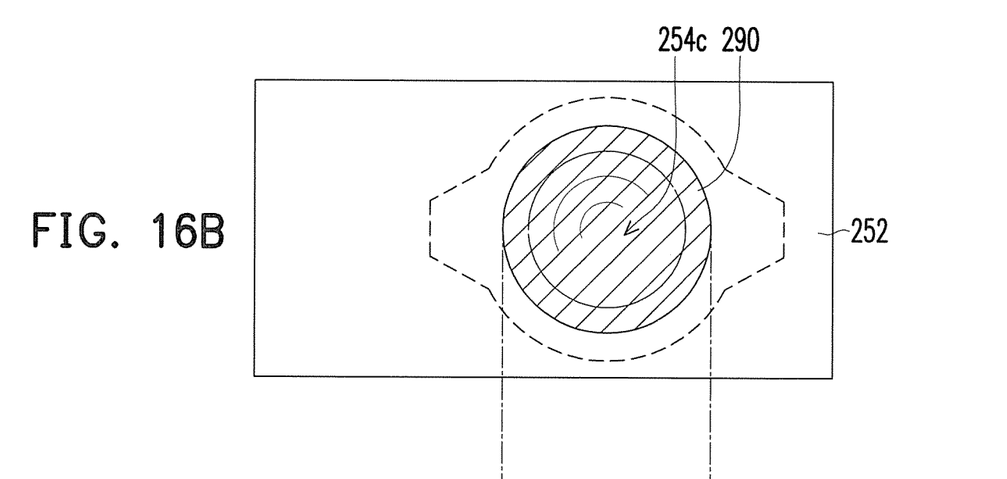
FIG. 16B is a schematic top view of the second redistribution layer of FIG. 16A.

FIG. 16A is an enlarged schematic partial cross-sectional view of a second redistribution layer according to some exemplary embodiments. FIG. 16B is a schematic top view of the second redistribution layer of FIG. 16A, and the conductive element 260 is not shown in FIG. 16B for illustrative purposes. Referring to FIG. 16A and FIG. 16B, similar to the embodiment of FIG. 15A and FIG. 15B, the second redistribution layer 250 of FIG. 16A and FIG. 16B is similar to the second redistribution layer 150 of the semiconductor package 100 of FIG. 1. The difference between the second redistribution layer 250 of FIG. 16A and the second redistribution layer 150 of FIG. 1 is that the second redistribution layer 250 further includes under bump metallurgies (UBM) pads 290 sandwiched between the polymer dielectric material layers 252, 256. In some embodiments, when forming the second redistribution layer 250, the UBM pads 290 are formed prior to forming the metallization layer 254. In some embodiments, a surface coating layer 254b is formed conformally covering the UBM pads 290. The polymer dielectric material layers 252, 256, 262 and 264 and the metallization layers 254, 258 are formed layer by layer similar to the formation process of the second redistribution layer 150. In certain embodiments, the UBM pads 290 may be regarded as contact pads and the topmost metallization. Similarly, the formation of through vias 232 is similar to the formation of the through vias 132. In some embodiments, the UBM pads 290 are connected to the contact pad 254a of the metallization layer 254. Similar to the description referring to FIG. 14A to FIG. 14C, the surface coating layer 254b and the UBM pads 290 may undergoes the dry etching process and wet etching process so as to form the concave portion 254c in the UBM pad 290. The relative configurations of the concave portion 254c, and the UBM pad 290 and the surface coating layer 254b are similar to the dimensions of the concave portion 154c, the contact pad 154a and the surface coating layer 154b described in FIG. 14C, and will not be repeated herein. Referring to FIG. 16B, in some embodiments, the top view shows that the concave portion 254c of the UBM pad 290 is exposed from the polymer dielectric material layer 252, and the rest of the UBM pad 290 is covered by the polymer dielectric material layer 252. Thus, in certain embodiments, the conductive element 260 is disposed mainly on the concave portion 254c of the UBM pad 290. Since the UBM pad 290 is formed with the concave portion 254c, solder paste and balls or bumps can be accurately located on the UBM pads 290 with better fixation, and the ball drop yield and reliability of the package structure are improved.

According to some embodiments, a semiconductor package has a first redistribution layer, a first die, a second redistribution layer, and a surface coating layer. The first die is encapsulated within a molding material and disposed on and electrically connected to the first redistribution layer. The second redistribution layer is disposed on the molding material, on the first die, and electrically connected to the first die. The second redistribution layer has a topmost metallization layer having at least one contact pad, and the at least one contact pad includes a concave portion. The surface coating layer covers a portion of the topmost metallization layer and exposes the concave portion of the at least one contact pad.

According to some embodiments, a semiconductor package includes a first die, an interconnect structure, and at least one conductive element. The first die is molded in a molding material. The interconnect structure is disposed aside of the molding material, and includes a plurality of through vias, a first redistribution layer, and a second redistribution layer. The through vias penetrate through the molding material. The first redistribution layer is disposed at a first side of the first die and connects to the through vias. The second redistribution layer is disposed at a second side of the first die, on the molding material and above the first redistribution layer, and connected to through vias. The first redistribution layer and the second redistribution layer are connected by the through vias. The second metallization assembly includes a topmost metallization layer having at least one contact pad and a surface coating layer. The surface coating layer covers a portion of the topmost metallization layer, and the at least one contact pad includes a concave portion exposed by the surface coating layer. The at least one conductive element is disposed on the concave portion of the at least one contact pad.

According to some embodiments, a manufacturing process includes the following steps. A carrier is provided. A first redistribution layer is formed on the carrier, wherein the first redistribution layer includes a metallization layer having at least one contact pad on the carrier. A plurality of through vias are formed on the first redistribution layer, wherein the through vias are electrically connected to the first redistribution layer. A first die is disposed on the first redistribution layer. The first die and the through vias are encapsulated in a molding material. A second redistribution layer is formed on the molding material and on a front surface of the first die, wherein the second redistribution layer is electrically connected to the through vias and the first die. A protection layer is disposed on the second redistribution layer. The carrier is debonded from the first redistribution layer to expose the metallization layer. The metallization layer of the first redistribution layer is etched to form a concave portion in the at least one contact pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
an encapsulated semiconductor die;
a redistribution layer, disposed on the encapsulated semiconductor die and electrically coupled to the encapsulated semiconductor die, wherein the redistribution layer comprises an outmost dielectric material layer, an outmost metallization layer having at least one first contact pad, and a surface coating layer sandwiched between the outmost dielectric material layer and the outmost metallization layer, and the at least one first contact pad includes a first concave portion exposed from the surface coating layer; and
at least one conductive element disposed on the first concave portion of the at least one first contact pad, wherein the surface coating layer is lower than a top surface of the outmost dielectric material layer, and the at least one conductive element is in contact with the outmost dielectric material layer, the surface coating layer and the first concave portion.

2. The semiconductor package as claimed in claim 1, wherein the outmost metallization layer further comprises second contact pads, and each of the second contact pads has a second concave portion exposed from the surface coating layer.

3. The semiconductor package as claimed in claim 2, further comprising a second semiconductor die disposed on the redistribution layer and electrical connectors disposed on the second concave portions of the second contact pads, wherein the second semiconductor die disposed on the electrical connectors are electrically connected to the redistribution layer through the electrical connectors.

4. The semiconductor package as claimed in claim 3, wherein the electrical connectors are in contact with the outmost dielectric material layer, the surface coating layer and the second concave portions.

5. The semiconductor package as claimed in claim 3, wherein the second semiconductor die includes a high voltage chip or a voltage modulation chip.

6. The semiconductor package as claimed in claim 1, further comprising a front redistribution layer disposed under the encapsulated semiconductor die and electrically connected with the encapsulated semiconductor die.

7. The semiconductor package as claimed in claim 6, further comprising at least one through via electrically connecting the redistribution layer and the front redistribution layer.

8. The semiconductor package as claimed in claim 1, wherein the encapsulated semiconductor die includes one or more fingerprint sensor.

9. The semiconductor package as claimed in claim 1, wherein the surface coating layer extends beyond a periphery of the first concave portion of the at least one first contact pad.

10. A semiconductor package comprising:
a first die encapsulated in a molding material;
a redistribution layer, disposed on the molding material and electrically connected with the first die, wherein the first die is disposed at a first side of the redistribution layer;
a second die, disposed at a second side of the redistribution layer opposite to the first side and electrically connected with the redistribution layer through electrical connectors therebetween; and
conductive elements, disposed at the second side of the redistribution layer,
wherein the redistribution layer includes an outmost dielectric material layer, an outmost metallization layer having first contact pads and second contact pads, and a surface coating layer sandwiched between the outmost dielectric material layer and the outmost metallization layer, the first contact pad has a first concave portion exposed from the surface coating layer, and the second contact pad has a second concave portion exposed from the surface coating layer, and
wherein the first concave portion, the surface coating layer and a top surface of the outmost dielectric material layer are located at different levels, the conductive elements are in contact with the outmost dielectric layer, the surface layer and the first concave portions of the first contact pads, and the electrical connectors are in contact with the outmost dielectric layer, the surface layer and the second concave portions of the second contact pads.

11. The semiconductor package as claimed in claim 10, wherein the surface coating layer extends beyond a periphery of the first concave portion and beyond a periphery of the second concave portion.

12. The semiconductor package as claimed in claim 10, further comprising a front-side redistribution layer disposed under the first die and on the molding compound and electrically connected with the first die.

13. The semiconductor package as claimed in claim 12, further comprising a protection layer located on the front-side redistribution layer, wherein the first die includes at least one fingerprint sensor.

14. The semiconductor package as claimed in claim 10, wherein the surface coating layer comprises titanium and copper.

15. A manufacturing process for a semiconductor package, comprising:
 providing a carrier;
 forming a first redistribution layer on the carrier, wherein forming the first redistribution layer comprises forming a surface coating layer, a dielectric material layer and a metallization layer having at least one contact pad on the carrier;
 disposing a first die on the first redistribution layer;
 encapsulating the first die in a molding material;
 forming a second redistribution layer on the molding material and on a front surface of the first die, wherein the second redistribution layer is electrically connected to the first die and the first redistribution layer;
 disposing a protection layer on the second redistribution layer;
 debonding the carrier from the first redistribution layer to expose the surface coating layer and the dielectric material layer;
 etching the surface coating layer and the at least one contact pad of the first redistribution layer to form a concave portion in the at least one contact pad, wherein the concave portion, the etched surface coating layer and a top surface of the dielectric material layer are at different levels, and; and
 disposing at least one conductive element on the concave portion of the at least one contact pad, wherein the at least one conductive element is electrically connected to the first redistribution layer.

16. The process as claimed in claim 15, wherein forming the first redistribution layer on the carrier comprises:
 forming a polymer dielectric material layer on the carrier;
 patterning the polymer dielectric material layer to form openings penetrating through the polymer dielectric material layer;
 forming the surface coating layer over the polymer dielectric material layer and conformally covering the openings;
 forming the metallization layer on the surface coating layer and the polymer dielectric material layer to fill the openings; and
 patterning the metallization layer and the surface coating layer.

17. The process as claimed in claim 15, wherein prior to forming the second redistribution layer, the process further comprises:
 planarizing the molding material to expose the front surface of the first die.

18. The process as claimed in claim 15, wherein etching the surface coating layer and the at least one contact pad of the first redistribution layer comprises:
 dry etching the surface coating layer covering the at least one contact pad of the metallization layer of the first redistribution layer to remove a portion of the surface coating layer; and
 wet etching the surface coating layer and the at least one contact pad to form the concave portion in the at least one contact pad.

19. The process as claimed in claim 18, wherein the surface coating layer comprises titanium and copper, dry etching the surface coating layer comprises performing a titanium dry etching process and wet etching the at least one contact pad comprises performing a titanium wet etching process.

20. The process as claimed in claim 18, wherein the concave portion of the at least one contact pad exposes a portion of a sidewall of the surface coating layer, and a distance from a lowest point of the concave portion of the at least one contact pad to a front surface of the first redistribution layer in a normal direction of the front surface of the first redistribution layer is greater than a height of the exposed portion of the sidewall of the surface coating layer in the normal direction.

* * * * *